United States Patent
Lee

[54] OPTICS FOR MULTI-TRACK HOLOGRAPHIC TAPE RECORDER

[75] Inventor: Tzuo-Chang Lee, Bloomington, Minn.

[73] Assignee: Honeywell Inc., Minneapolis, Minn.

[21] Appl. No.: 632,338

[22] Filed: Nov. 17, 1975

[51] Int. Cl.² .............................................. G03H 1/16
[52] U.S. Cl. .................................................. 350/3.5
[58] Field of Search ........................................ 350/3.5

[11] 4,045,115
[45] Aug. 30, 1977

[56] References Cited
U.S. PATENT DOCUMENTS 3,833,893   9/1974   Rajchman .............................. 350/3.5

Primary Examiner—William L. Sikes
Attorney, Agent, or Firm—Omund R. Dahle

[57] ABSTRACT

Optics for a multi-track holographic tape recorder are disclosed. A multiplicity of one-dimensional page composers and passive optical means store the data in a multiple track format on a moving tape.

11 Claims, 12 Drawing Figures

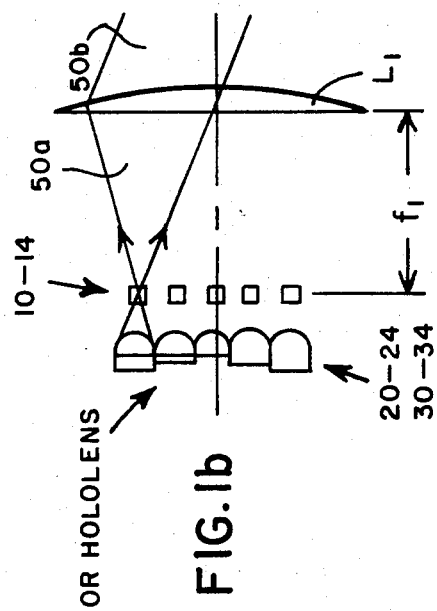
FIG. 1b
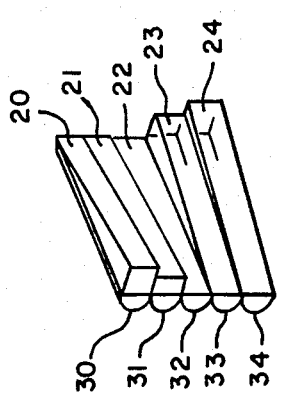
FIG. 1a
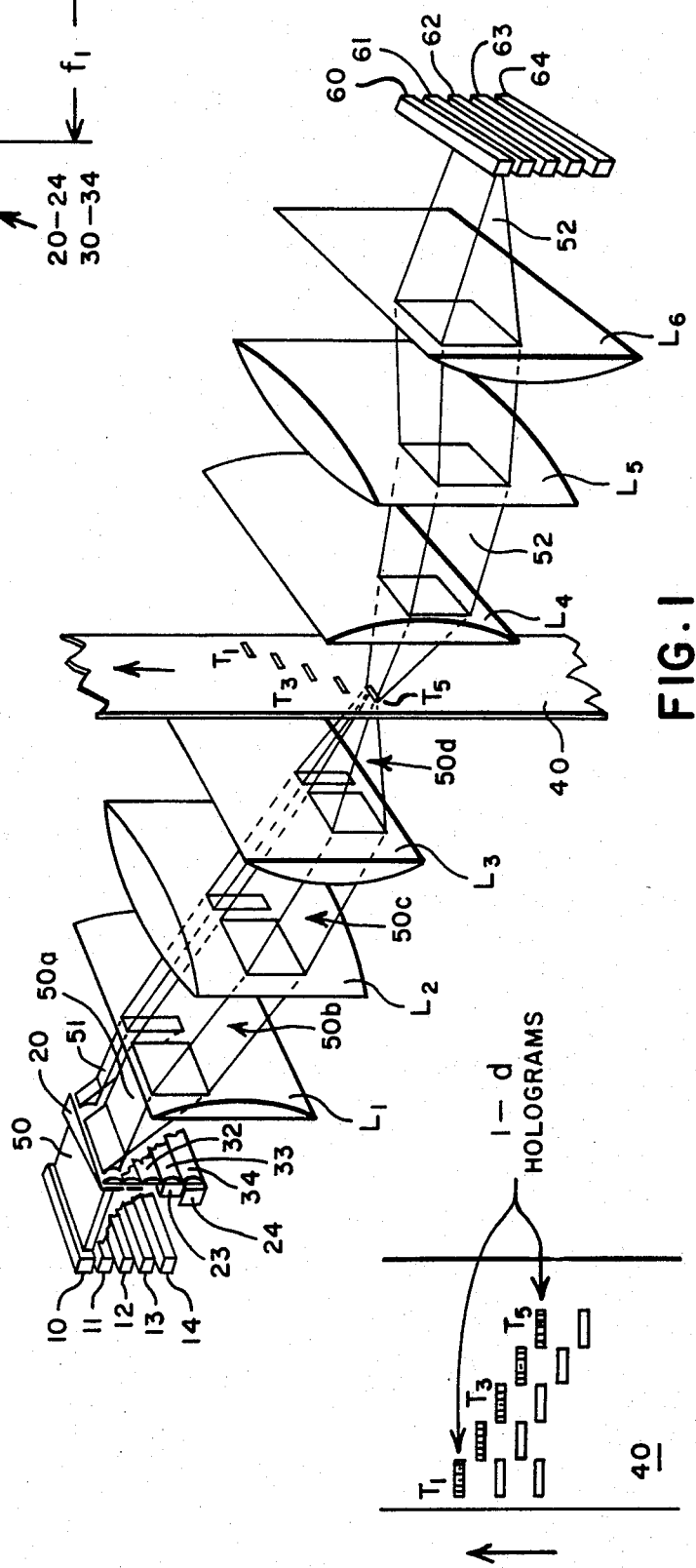
FIG. 1
FIG. 2

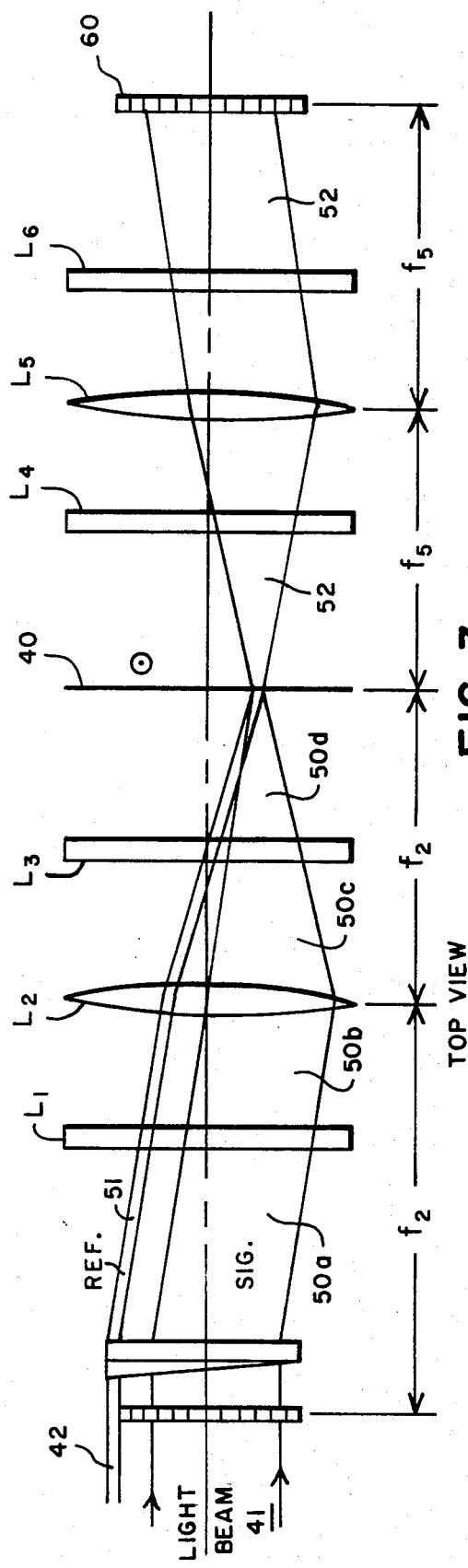
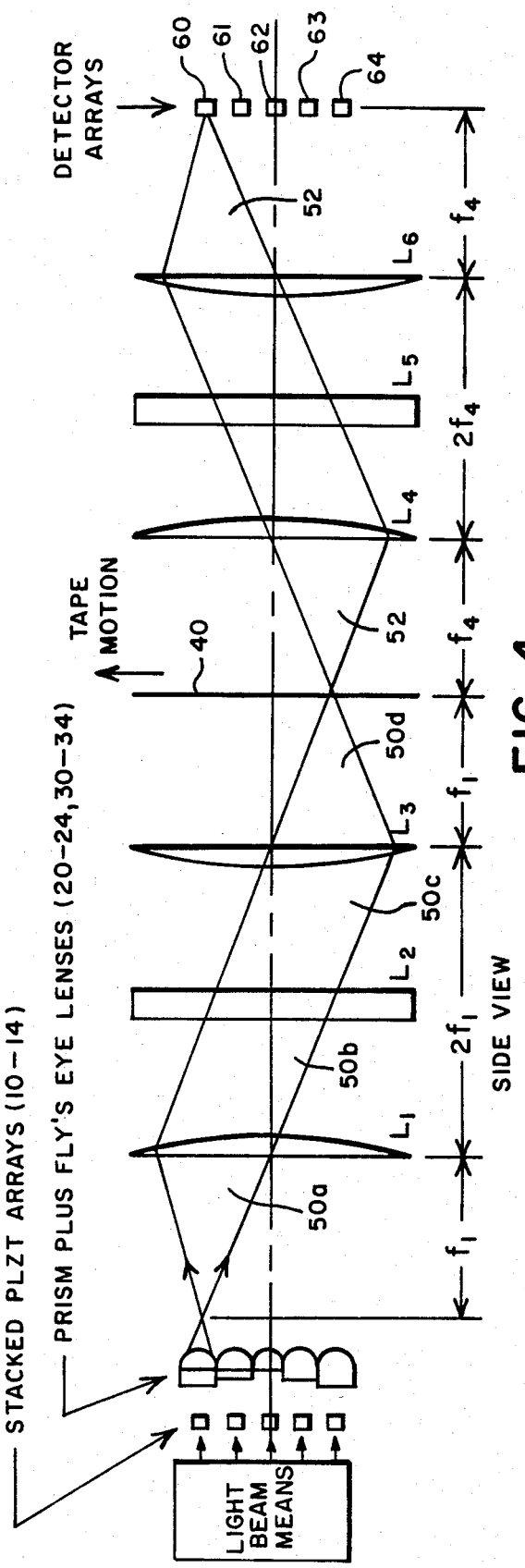

DATA RECORDING

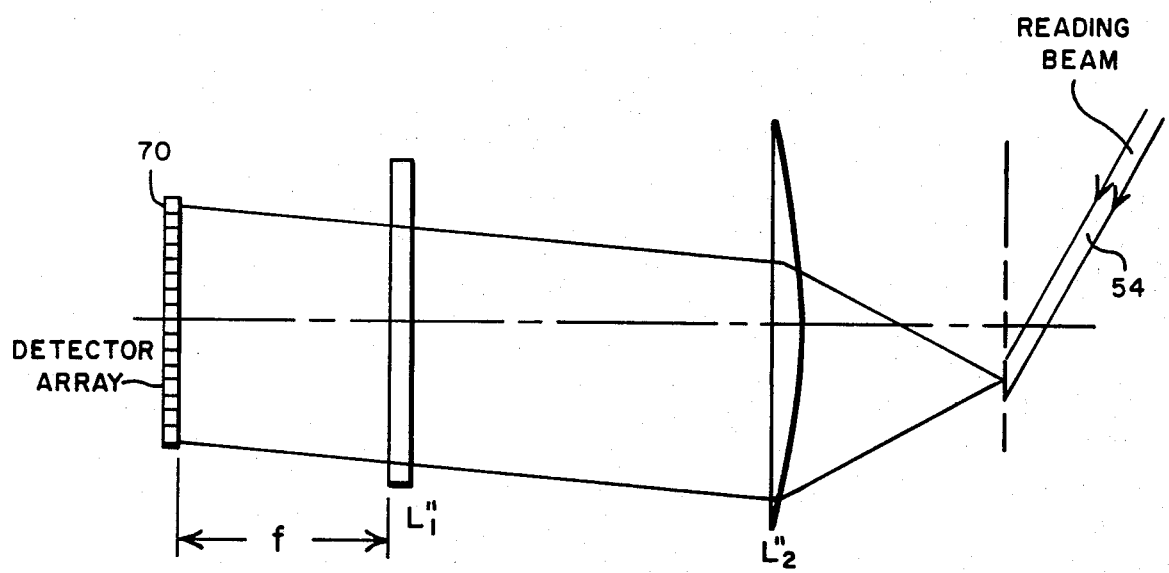
FIG. 5b — DATA REPRODUCE
OPTICS FOR MAKING A HOLOLENS
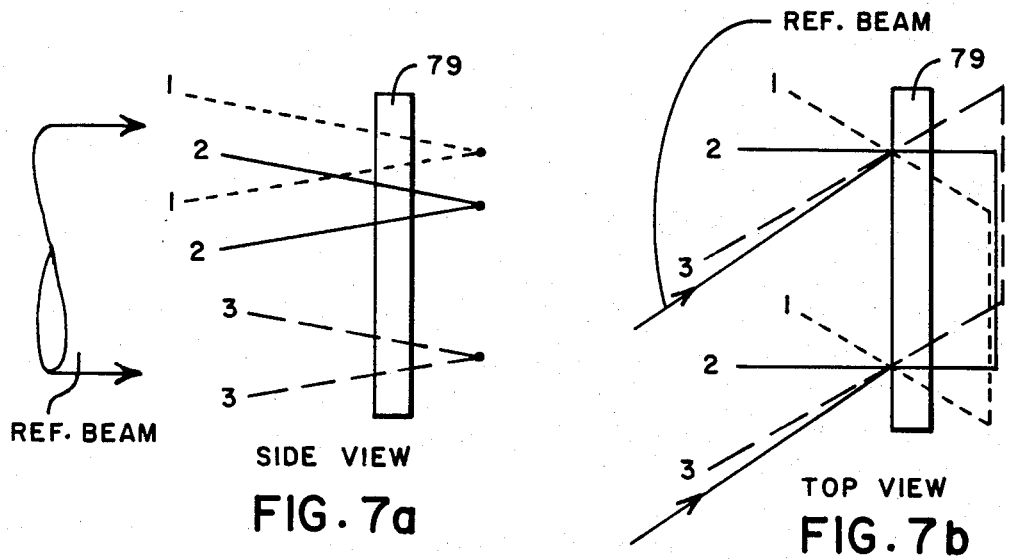
FIG. 7a  SIDE VIEW
FIG. 7b  TOP VIEW
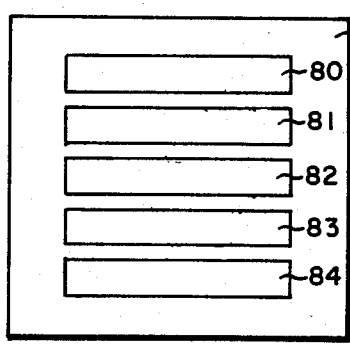
FIG. 8
FRONT VIEW OF THE HOLOLENS TO REPLACE THE PRISM — LENSLET ASSEMBLY

OPTICS FOR MULTI-TRACK HOLOGRAPHIC TAPE RECORDER

BACKGROUND AND SUMMARY OF THE INVENTION

The ever increasing needs for the storage of large quantities of data in modern computer systems have required the development of new techniques for information storage. Optical techniques, such as holography, permit high density information storage greater than that attainable with conventional magnetic recording. In a holographic memory, the information stored in the hologram is stored uniformly throughout the hologram rather than in discrete areas. The hologram is thus relatively insensitive to blemishes or dirt on the memory medium. A small blemish or dust particle on the memory medium cannot obscure a bit of digital data as it can in a bit-by-bit memory.

As background, in the co-pending application Ser. No. 424,991, filed Dec. 14, 1973, titled "Holographic Memory with Moving Memory Medium" by M. F. Braitberg and T. C. Lee, and assigned to the same assignee as the present invention the basic technique of storing one-dimensional (one-d) holograms using a one-d page composer as the input is described. The teachings of that application are incorporated by reference. In that reference each such one-d hologram formed one track on the moving tape.

Briefly explained, the referenced co-pending application is a holographic optical memory in which many holograms are stored on a moving memory medium. In a holographic memory, each hologram represents a different bit pattern or "page" and a single hologram may represent a page containing as many as $10^5$ bits. Information is stored by directing an information beam and a reference beam to a desired location on the memory medium. The information beam, which contains a bit pattern formed by a page composer, interferes with the reference beam to form the hologram. To read out the information, a readout beam selectively illuminates one of the holograms stored, thereby producing a reconstructed image of the bit pattern stored in the hologram. An array of photodetectors is positioned to detect the individual bits of the reconstructed bit pattern.

The holographic system of the reference application uses mutually coherent signal and reference beams to store one-dimensional Fourier transform holograms on a moving memory medium. A page composer creates an elongated bit pattern in the signal beam. This elongated bit pattern contains a plurality of bits arranged in an essentially linear array. Fourier Transform means produces a one-dimensional Fourier Transform of the elongated bit pattern at the memory medium. The mutually coherent signal and reference beams interfere at the memory medium to store a one-dimensional Fourier Transform hologram having interference fringe lines and an elongated dimension. The interference fringe lines run parallel to the direction of motion of the memory medium, and the elongated dimension is essentially orthogonal to the direction of motion. An advantage of the fringe lines running parallel to tape motion is that it allows more exposure time which means minimum peak power requirement from the laser source. In the referenced application only the optics of a single track format is shown.

This invention relates to holography, and in particular to passive optics for a multi-track holographic tape recorder, that is, to optics for utilizing a multiplicity of linear page composers and for storing the data as one-dimensional holograms in a multiple track format on a moving tape. In so doing, the full tape surface becomes available storage area and a large amount of data can be stored on tapes holographically at rates up to 10 gigabits/sec.

BRIEF DESCRIPTION OF THE DRAWINGS

FIG. 1 is a perspective view of optical components described for a multi-track holographic tape recorder;

FIG. 1a shows an enlarged view of a portion of FIG. 1;

FIG. 1b shows a modification of one portion of FIG. 1;

FIG. 2 illustrates multiple tracks of one-d holograms on the recording tape;

FIGS. 3 and 4 are top and side views of FIG. 1, respectively;

FIGS. 5a, 5b, and 6 disclose another modification of the invention;

FIGS. 7a–7b disclose an example of preparing a hololens; and

FIG. 8 is a front view of the hololens.

DESCRIPTION

Figure 5A:
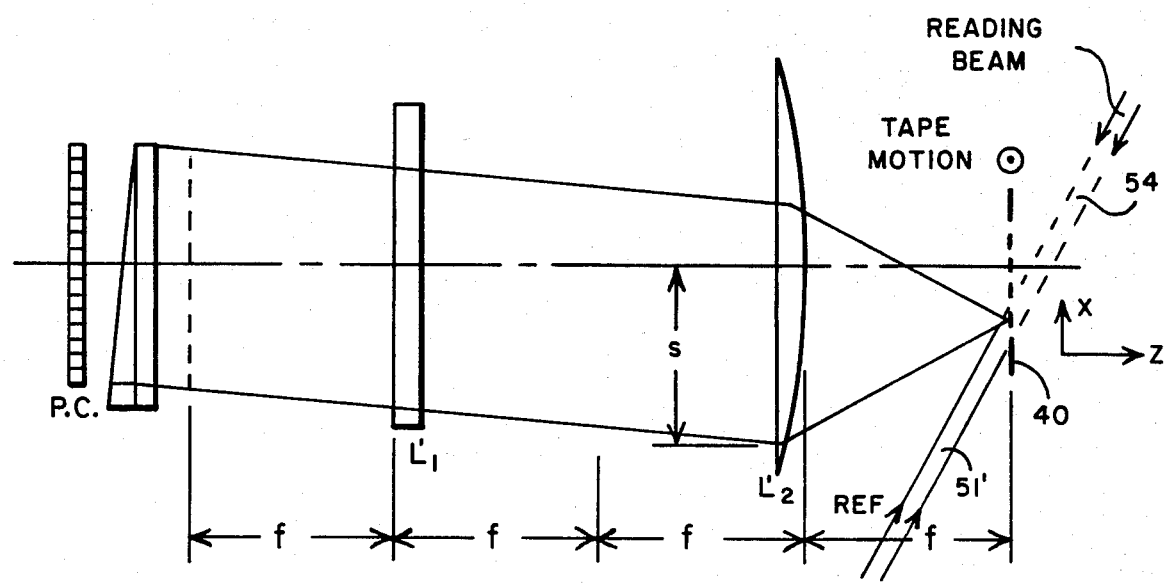

FIG. 1 is drawn to provide a perspective view of the optical components for the multi-track holographic tape recorder. This Figure, when considered together with the top view of FIG. 3 and the side view of FIG. 4, sets out clearly the function and focal lengths of the various components. A plurality of stacked PLZT (lanthanum modified lead-zirconate-titanate) linear (one-dimensional) page composers 10–14 provide information. Five such page composers have been shown for illustrative purposes, but this is not intended to be limiting. Each of the linear page composers 10–14 contains many active light valves, the number of which may be, for example, in the range of 100 to 300. Cooperating optically with the page composers are a plurality of prisms 20–24, each linear page composer having associated with it a prism which deflects the beam into a particular track position. The prisms 20–24 are generally of a wedge shape with different prisms having different thicknesses, one from the next, to cause greater or less deflection of the beam and to the right or to the left. Also shown are a plurality of cylindrical lenslets or fly's eye cylinder lenses 30–34, each page composer having associated with it a lenslet. The separation of the one-d holograms in the y direction (i.e., the tape motion direction) is accomplished by the lenslets 30–34 and separation into tracks $T_1$, $T_2$ etc. (i.e., the tape width direction) is by the prisms 20–24. FIG. 1a shows the reverse side of the prism-cylindrical lenslet assembly, and this assembly can be molded into one unit, if desired. The next components of FIG. 1 are cylindrical lenses $L_1$, $L_2$, and $L_3$ which focus the beam at the plane of a holographic tape 40. These lenses comprise Fourier Transform means. The conjugate lens system provides a flat field in the Fourier Transform plane, which is also the tape 40 plane. The top view FIG. 3 shows most clearly that the focal point of lens $L_2$ is at the tape plane 40, and in similar manner FIG. 4 shows the focal point of lens $L_3$ at the plane of tape 40. The lenses shown in the Figures are representative of the function performed and may be multi-element lenses or single element lenses, as desired.

A light beam 41, which may be collimated if desired, FIG. 3, simultaneously illuminates all of the page composers 10–14 and is modulated by them. The illumination is provided by a laser beam which first goes through optics not illustrated comprising a spatial filter, a modulator and optics to expand the beam to beam 41. FIG. 1 shows the path of a simulated modulated information beam 50 emerging from one of the one-d page composers 10 and continuing until it is converted to a one-d Fourier Transform hologram of the holographic tape 40 at track position T5. Subsequent to passing through prism 20 and lenslet 30, the beam, now shown as portion 50a, may be traced through cylinder lens $L_1$, beam portion 50b, cylinder lens $L_2$, beam portion 50c, cylinder lens $L_3$ and beam portion 50d which reaches a focal point at the plane of the tape 40. A reference beam 51 may pass through the same series of lenses and be directed to the same location as beam 50 at the tape 40. The signal beam and the reference beam converge and interfere to form the one-dimensional hologram. Modulated beams from page composers 11, 12, 13, and 14 will also be simultaneously recorded on tape 40 at track positions $T_4$, $T_3$, $T_2$, and $T_1$ in the same manner as described above. The direction of tape motion is indicated on the various Figures and as the tape advances, a next multi-track set of holograms is stored on the tape as shown in FIG. 2. As pointed out above, in utilizing a multiplicity of linear page composers with optics for storing the data in a multiple track format on a moving tape, a single data rate and a large storage density can be achieved on tapes holographically.

The FIGS. 1, 3, and 4 also disclose readout apparatus. FIGS. 1, 3, and 4 do not intend to suggest that writing on tape 40 and readout occur at the same time. Also, the readout apparatus to be described may be physically located or positioned downstream from the recording apparatus described above, if desired. When a reading beam, which may be reference beam 51, is transmitted to a stored hologram on tape 40, for example, at the location $T_5$, the beam illuminates the stored hologram at $T_5$. The reading beam is diffracted by the stored hologram to form readout beam 52, which passes through the further lenses $L_4$, $L_5$, and $L_6$ to photodetector array 60 positioned to detect the individual bits of the reconstructed bit pattern. Detector arrays 61 through 64 similarly detect the reconstructed bit patterns of holograms at tracks $T_4$ through $T_1$, respectively.

FIGS. 1, 3, and 4 show the beam 41 passing first through the page composers and then through the prism-lenslet assembly. A modification of this structure is shown in FIG. 1b where the page composers are moved to the other side of the prism-lenslet assembly and placed in the plane of the focal point of the array of lenslets. An important advantage of the modification of FIG. 1b is that the prism-lenslet assembly can be fabricated in the form of a single hologram plate or hololens fully reproducing the optical functions performed by the assembly. In other words, the prism-lenslet assembly can be replaced by a hololens which contains all the optical instructions of the assembly it replaces. A hololens is defined as a hologram, the function of which is to act as a special purpose lens.

Figure 6:
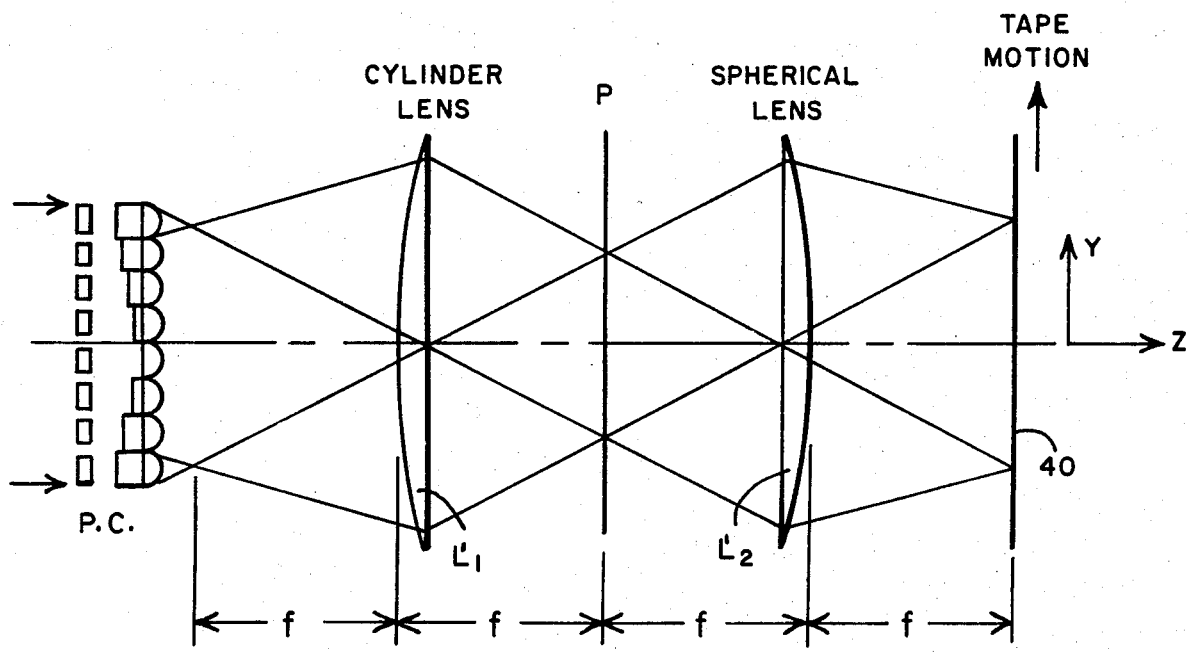

FIGS. 5 and 6 illustrate a modification of the optics of the earlier figures in that lens $L_2'$ is a spherical lens instead of a cylinder lens. FIG. 5a is a top view laid out in the general form of FIG. 3 and FIG. 6 is a side view of the same assembly. The reference beam 51' is brought in from a different direction than in the case of the reference 51 of FIG. 1. FIG. 5b shows that in reproducing the data stored on tape 40 by the apparatus of FIGS. 5a and 6, a reading beam 54 illuminates the hologram and spherical lens $L_2''$ together with cylinder lens $L_1''$ directs the information to a detector array 70.

Two arrangements for reproducing or readout of the information stored in a hologram on tape 40 have thus been shown. In FIGS. 1, 3, and 4, the reading beams comes from the same side of the tape 40 as the recording beams and is projected through the symmetrical lens arrangement ($L_4$, $L_5$, $L_6$) beyond the tape 40 to the detector arrays. In FIGS. 5a, 5b, and 6 the reading beam 54 is the complex conjugate of the reference beam, and projects the information stored on the hologram back in the direction from which it was recorded, through lenses $L_2''$ and $L_1''$ similar to those used for recording, to detector array 70.

Reference is made above in connection with FIG. 1b to fabricating the prism-cylindrical lenslet assembly in the form of a single hologram plate 79. FIGS. 7a and 7b illustrate one example of generating a hololens to be so utilized. Information beams 1—1, 2—2, 3—3, etc. together with a reference beam provide a hologram plate having sections 80 to 84 in FIG. 8 equivalent to the five cylindrical lenslets 30–34 of FIG. 1. The sections 80–84 are most clearly shown in the front view, FIG. 8. The focal length of these sections 80–84 is the same as the focal length of the lenslets 30–34, and is most clearly shown in side view FIG. 7a and top view FIG. 7b. Top view 7b also shows the information beams impinging the tape at different angles so that the recorded hololens sections provide the desired diffraction of the prisms 20–24 referred to earlier in discussion of FIG. 1b. At the right edge of FIG. 7b, the vertical portions (i.e. the focal points) of beams 1—1, 2—2, and 3—3, which actually partially overlie one another in a top view presentation, are shown slightly separated for clarity.

The embodiments of the invention in which an exclusive property or right is claimed are defined as follows:
 1. A multi-track holographic recorder comprising:
  a plurality of one-dimensional page composers;
  light beam means for supplying mutually coherent signal and reference beams, and signal beam simultaneously illuminating all of said page composers;
  passive optical means for simultaneously directing a light beam from each page composer to a separate location at a memory medium, said passive optical means including optical Fourier Transform means, each light beam at the memory medium forming a one-dimensional Fourier Transform of the information in the page composer and each Fourier Transform interferring with the mutually coherent reference beam to form a one-dimensional hologram.
 2. The invention according to claim 1 in which the plurality of page composers are positioned in a first plane.
 3. The invention according to claim 2 in which the passive optical means includes a cylindrical lenslet for each of said page composers, said plurality of lenslets positioned in a second plane parallel to the first plane.
 4. The invention according to claim 3 in which a plurality of said lenslets have in conjunction therewith individual prism means to cause the light from each page composer to be deflected to a separate track, respectively, at the memory medium.
 5. The invention according to claim 4 in which the lenslet and prism assembly comprises a hologram plate fully reproducing the functions to be performed by the assembly.

6. The invention according to claim 1 in which a portion of the passive optical means comprises a hologram plate.

7. The invention according to claim 2 in which the plurality of one-dimensional page composers each comprise a plurality of adjacent light valves.

8. The invention according to claim 1 in which the light beam means is collimated coherent light beam.

9. The invention according to claim 1 and further including readout means comprising:
- optical means for converting the hologram into a bit pattern indicative of the stored information; and
- a plurality of one-dimensional detector arrays, each positioned to readout the recorded information from the hologram in a different one of the separate locations.

10. A multi-track holographic recorder comprising:
- a plurality of one-dimensional page composers;
- light beam means for supplying mutually coherent signal and reference beams, said signal beam simultaneously illuminating all of said page composers;
- first passive optical means for simultaneously directing a light beam from each page composer to a separate location at a memory medium;
- optical Fourier Transform means in the light beam path forming from each light beam at the memory medium a one-dimensional Fourier Transform of the information in the respective page composer; and,
- second optical means directing said mutually coherent reference beam to each of said separate locations at the memory medium to interfere with the Fourier Transforms to form one-dimensional holograms.

11. The invention according to claim 9 and further including readout means comprising:
- optical means for converting the hologram into a bit pattern indicative of the stored information; and
- a plurality of one-dimensional detector arrays, each positioned to readout the recorded information from the hologram in a different one of the separate locations.

* * * * *